(12) United States Patent
Elnozahy et al.

(10) Patent No.: US 8,250,298 B2
(45) Date of Patent: Aug. 21, 2012

(54) MECHANISMS FOR REDUCING DRAM POWER CONSUMPTION

(75) Inventors: Elmootazbellah N. Elnozahy, Austin, TX (US); Karthick Rajamani, Austin, TX (US); William E. Speight, Austin, TX (US); Lixin Zhang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 12/789,019

(22) Filed: May 27, 2010

(65) Prior Publication Data

US 2011/0296097 A1    Dec. 1, 2011

(51) Int. Cl.
*G06F 12/00* (2006.01)
(52) U.S. Cl. ..................................... 711/105
(58) Field of Classification Search .................. None
See application file for complete search history.

(56) References Cited

U.S. PATENT DOCUMENTS

| | | | |
|---|---|---|---|
| 5,684,978 A * | 11/1997 | Sarma et al. ............... 711/169 |
| 6,094,705 A | 7/2000 | Song | |
| 6,470,433 B1 | 10/2002 | Prouty et al. | |
| 6,778,455 B2 | 8/2004 | Bell | |
| 7,257,041 B2 | 8/2007 | Cheng et al. | |
| 7,336,551 B2 | 2/2008 | Bains | |
| 7,380,083 B2 | 5/2008 | Bellows et al. | |
| 2004/0078515 A1* | 4/2004 | Tsuchida et al. ............ 711/106 |
| 2005/0066114 A1* | 3/2005 | Barth et al. ................. 711/105 |
| 2008/0137464 A1 | 6/2008 | Kim | |
| 2008/0219071 A1 | 9/2008 | Yuan et al. | |
| 2009/0097346 A1 | 4/2009 | Rao | |

OTHER PUBLICATIONS

Wingard, Drew E., "In depth: DRAM technology for SOC designers", Electronic News, Tuesday Aug. 18, 2009, 7 pages.
Ghosh, Mrinmoy et al., "DRAM Decay: Using Decay Counters to Reduce Energy Consumption in DRAMS", Proceedings of the 3rd Watson Conference on Interaction between Architecture, Circuits, and Compilers (P=AC2), Yorktown Heights, NY, Oct. 2006, 8 pages.

* cited by examiner

*Primary Examiner* — Brian Peugh
(74) *Attorney, Agent, or Firm* — Stephen J. Walder, Jr.; Libby Z. Toub

(57) ABSTRACT

Mechanisms are provided for inhibiting precharging of memory cells of a dynamic random access memory (DRAM) structure. The mechanisms receive a command for accessing memory cells of the DRAM structure. The mechanisms further determine, based on the command, if precharging the memory cells following accessing the memory cells is to be inhibited. Moreover, the mechanisms send, in response to the determination indicating that precharging the memory cells is to be inhibited, a command to blocking logic of the DRAM structure to block precharging of the memory cells following accessing the memory cells.

20 Claims, 6 Drawing Sheets

MECHANISMS FOR REDUCING DRAM POWER CONSUMPTION

BACKGROUND

The present application relates generally to an improved data processing apparatus and method and more specifically to mechanisms for reducing dynamic random access memory (DRAM) power consumption and improving DRAM performance.

Many modern computing devices use dynamic random access memory (DRAM) structures, such as in a main memory, system memory, cache memory, or other memory structures of the computing device. DRAM is a type of volatile random access memory that stores each bit of data in a separate capacitor within an integrated circuit. Since capacitors leak charge, the information in the DRAM cells eventually fades unless the capacitor charge of the DRAM cells is refreshed periodically. Because of this refresh requirement, DRAM is "dynamic" memory as opposed to static random access memory (SRAM) which is "static." The advantage of DRAM over SRAM is that it only requires one transistor and a capacitor per bit of data that is stored as opposed to six transistors in an SRAM per bit of data. This allows DRAM to reach very high density.

Refreshing DRAM cells may be performed on a periodic basis, such as at a predetermined refresh interval. The refreshing of DRAM cells may also occur, for example, in response to the reading of data out of the DRAM cells. That is, a typical read of a portion of a DRAM structure involves reading out the data from the DRAM cells, which effectively deletes the contents of the DRAM cells due to the loss of charge from the reading operation, with a subsequent rewriting of the data back into the same DRAM cells. Thus, each read of a DRAM structure involves the sensing of charge in the DRAM cells with a subsequent recharging of the DRAM cells to their previous state by rewriting the data back into the DRAM cells, consuming power and leading to a source of DRAM inefficiency.

SUMMARY

In one illustrative embodiment, a method, in a data processing system, is provided for inhibiting precharging of memory cells of a dynamic random access memory (DRAM) structure. The method comprises receiving a command for accessing memory cells of the DRAM structure. The method further comprises determining, based on the command, if precharging the memory cells following accessing the memory cells is to be inhibited. Moreover, the method comprises sending, in response to the determination indicating that precharging the memory cells is to be inhibited, a command to blocking logic of the DRAM structure to block precharging of the memory cells following accessing the memory cells.

In another illustrative embodiment, an apparatus is provided that comprises a dynamic random access memory (DRAM) structure and a DRAM controller coupled to the DRAM structure. The DRAM controller receives a command for accessing a memory cell of the DRAM structure and determines, based on the command, if precharging the memory cell following accessing the memory cell is to be inhibited. Moreover, the DRAM controller sends, in response to the determination indicating that precharging the memory cell is to be inhibited, a command to blocking logic of the DRAM structure to block precharging of the memory cell following accessing the memory cell.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
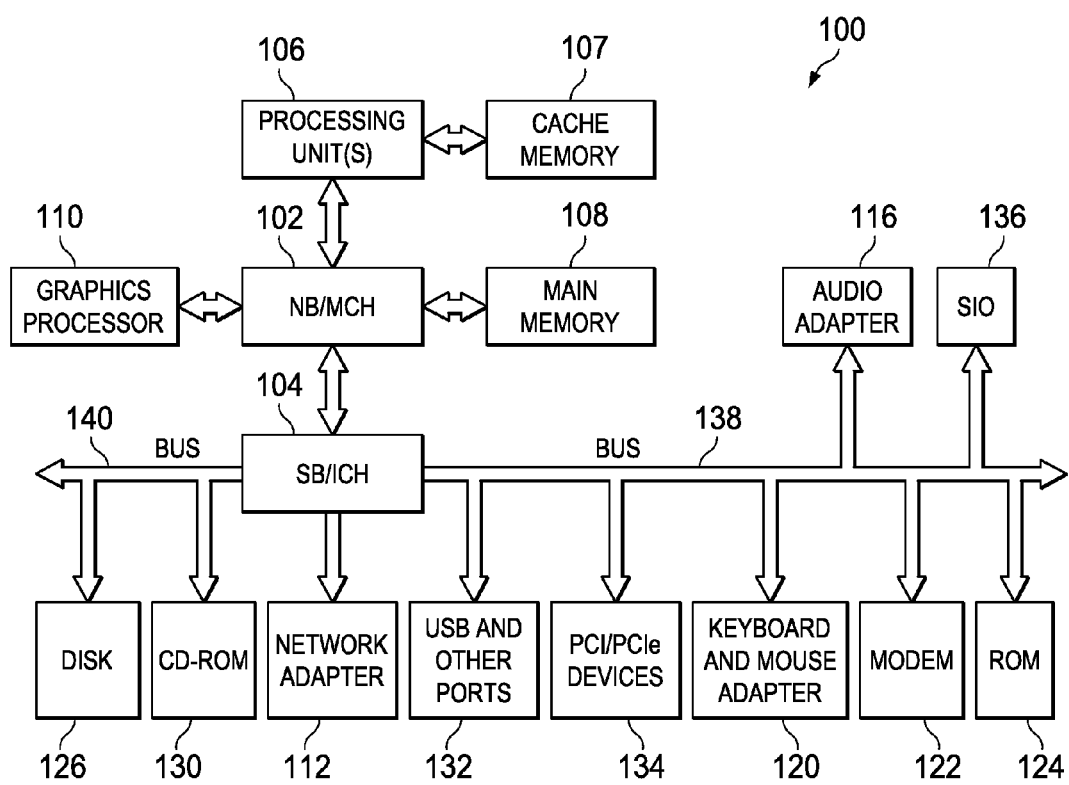
FIG. 1 is an example diagram of a data processing system in which aspects of the illustrative embodiments may be implemented.

The illustrative embodiments provide a mechanism for reducing the power consumption and improving the performance of a dynamic random access memory (DRAM) structure. The mechanisms of the illustrative embodiments determine if some data stored in a DRAM structure is to be changed in the near future and if so, mechanisms are provided to inhibit the refresh of DRAM cells storing this data. Furthermore, if data is read from DRAM and stored into another part of the system, e.g., any processor cache, the data is not written back to the DRAM cells. This, in effect, reduces the power consumption of the DRAM structure by avoiding power consumption associated with refreshing or rewriting data in the DRAM cells that is not going to be used again or is present elsewhere in the system and thus, can be accessed from another storage location.

In one illustrative embodiment, a new special DRAM "read with intent to modify" command may be provided that informs the DRAM controller that the data being read from the DRAM structure is going to be modified. As a result, unlike today's DRAM technology, the data is not written back to the DRAM cells from which it is read. Moreover, after the "read with intent to modify" command has been executed and the required data read out of DRAM, the cyclical refresh of the corresponding cells is disabled until the future modification is written back to DRAM.

In another illustrative embodiment, a validity bit for each predetermined portion of a DRAM structure, e.g., a cache line, a DRAM page, or the like, is provided in the DRAM controller. The validity bit is set when the associated portion of the DRAM structure is not to be refreshed or rewritten to the DRAM memory after a DRAM read operation. In addition, the illustrative embodiments provide a mechanism by which subsequent requests for data from a portion of the DRAM structure that has not been maintained through a refresh or rewrite operation are redirected to another storage location where the data is present, such as in a cache or the like. Furthermore, writes to the DRAM structure, such as by writing from another storage device, evictions of data from a cache or other memory structure, or the like, result in data being written to the DRAM structure and valid bits, associated with the portion of the DRAM structure being written, being cleared. Once the new data have been written to the DRAM structure, the cyclical refresh of the corresponding cells is re-enabled. For example, data associated with a portion of a cache that is evicted from the cache hierarchy may be written back to the DRAM cells and the valid bits associated with the portions of the DRAM structure that are written are cleared.

As will be appreciated by one skilled in the art, various aspects of the present invention may be embodied as a system, method, or computer program product. Illustrative embodiments of the present invention utilize a combination of hardware elements and software elements (including firmware, resident software, micro-code, etc.) with the combination of hardware and software elements being generally referred to herein as a "circuit," "module" or "system." Furthermore, aspects of the present invention may take the form of a computer program product embodied in any one or more computer readable medium(s), such as in firmware, memory devices, or the like, having computer usable program code embodied thereon.

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by hardware elements or a combination of hardware elements and software elements of the illustrative embodiments.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in a different order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The illustrative embodiments may be utilized in many different types of data processing environments including a distributed data processing environment, a single data processing device, or the like. With reference now to FIG. 1, a block diagram of an example data processing system is shown in which aspects of the illustrative embodiments may be implemented. Data processing system 100 is an example of a computer in which hardware mechanisms and computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP). The processing units 106 may have one or more associated cache memories 107 at one or more levels, e.g., L1 cache, L2 cache, and/or the like. The cache memories 107 may receive data/instructions retrieved from main memory 108 for quicker access by the processing units 106, as is generally known in the art. Graphics processor may use the main memory 108 directly and contain one or more private memories. However, as mentioned hereafter, in accordance with the mechanisms of the illustrative embodiments, the cache memories 107 and/or main memory 108 may be augmented to include hardware and/or software mechanisms for conserving power with regard to the refreshing or rewriting of the memory cells in these memories 107 and 108.

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 100 (Java is a trademark of Sun Microsystems, Inc. in the United States, other countries, or both).

As a server, data processing system 100 may be, for example, an IBM® eServer™ System P® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

As mentioned above, the illustrative embodiments provide mechanisms for reducing the power consumption and improving performance of dynamic random access memory (DRAM) in computing devices, such as the data processing system 100 in FIG. 1 or other type of computing device. For example, in the data processing system 100 in FIG. 1, the main memory 108 or cache memory 107 may be provided as a DRAM structure that may implement the mechanisms of the illustrative embodiments as described herein. That is, the DRAM structure of the illustrative embodiments comprises hardware and/or software mechanisms for inhibiting the refreshing or rewriting of DRAM cells that are determined to store information that is going to be modified or is otherwise available from another memory structure, e.g., a different cache memory or the like.

Figure 2:
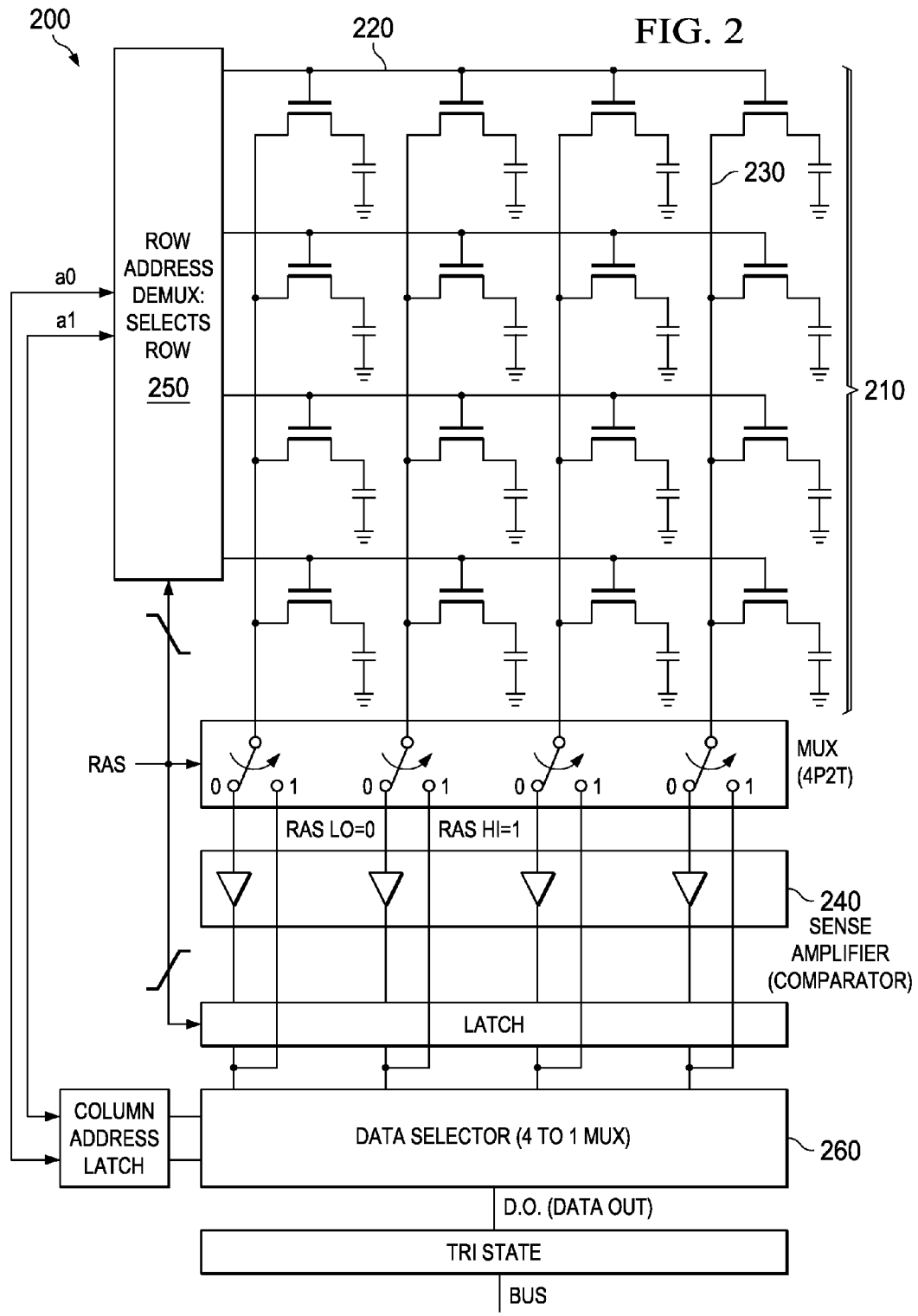
FIG. 2 is an example circuit diagram of a known DRAM structure.

FIG. 2 is an example circuit diagram of a known DRAM structure 200. As is generally known in the art, a DRAM structure 200 usually comprises a square array of memory cells 210, with each cell comprising a single capacitor and a single transistor. Signal lines connecting each row of the array are known as word lines 220. Each column of the array is actually composed of two bit lines (only one is shown for simplicity) 230, each one connected to every other memory cell in the column. These bit lines 230 are generally known as the + and − bit lines. A sense amplifier 240 is typically provided as a pair of cross-connected inverters between the bit lines 230. That is, the first inverter is connected from the + bit line to the − bit line, and the second inverter is connected from the − bit line to the + bit line. This is an example of a positive feedback sense amplifier 240 in which the arrangement is only stable when one bit line has a high logic level state and the other bit line has a low logic level state.

With this known DRAM structure 200 arrangement, to read a bit from a column, the following operations take place. First, the sense amplifier 240 is switched off and the bit lines 230 are precharged to exactly matching voltages that are intermediate between high and low logic levels. The bit lines 230 are constructed symmetrically to keep them balanced as precisely as possible. The precharge circuitry (not shown) is then switched off. Because the bit lines 230 are very long, their capacitance will hold the precharge voltage for a brief time.

The selected row's word line 220, as determined by the row address demux 250, is then driven high. This connects one storage capacitor of one of the memory cells to one of the two bit lines. Charge is shared between the selected storage cell and the appropriate bit line 230, slightly altering the voltage on the bit line 230. Although every effort is made to keep the capacitance of the storage cells high and the capacitance of the bit lines low, capacitance is proportional to physical size, and the length of the bit lines 230 means that the net effect is a very small perturbation of one bit line's voltage.

The sense amplifier 240 is then switched on. The positive feedback takes over and amplifies the small voltage difference until one bit line is at a fully low logic level state and the other is fully high logic level state. At this point, the row is "open" and a column can be selected. "Read" data is taken from the DRAM structure 200 by the sense amplifier 240, as selected by a column address via data selector 260. Many reads can be performed while the row is open in this way.

While reads of the open row proceed, current is flowing back up the bit lines 230 from the sense amplifier 240 to the memory cells. This restores, or "refreshes," the charge in the memory cell. Due to the length of the bit lines 230, this takes significant time beyond the end of sense amplification, and overlaps with one or more column reads. Moreover, this refreshing or rewriting requires additional power consumption which may be unnecessary for memory cells storing data that will be soon overwritten or is available from another memory structure in the computing or data processing system.

When done with the current row, the word line 220 is switched off to disconnect the storage capacitors, i.e. the row is "closed." The sense amplifier 240 is then switched off and the bit lines 230 are precharged again.

To write to a DRAM structure 200 the row to be written to is "opened" and a given column's sense amplifier 240 is temporarily forced to a desired state so that it drives the bit line 230 which charges the capacitor to the desired value. Due to the positive feedback, the sense amplifier 240 will then hold the bit line 230 stable even after the forcing is removed. During a write to a particular DRAM cell, the entire row is read out, portions of the row are changed, and then the entire row is written back in.

The refreshing and rewriting of data in a DRAM cell requires additional power consumption and incurs a potential performance penalty, since the cells are unavailable for reads or writes while they are being refreshed. This refreshing overhead in power and performance may not be necessary for data that will be soon overwritten and/or is available from another memory structure, such as another cache or the like. Currently, there is no mechanism available in a DRAM structure for discerning which data is to be modified in the future, which data is not going to be modified in the future, which data is available from another memory structure, and/or which data is not available from another memory structure. Moreover, there is no mechanism available for inhibiting the refreshing or writing back of data into a DRAM structure when it is determined that the data to be refreshed or written back is going to be overwritten soon or is available from another memory structure. The illustrative embodiments of the present invention, however, provide such mechanisms.

Figure 3:
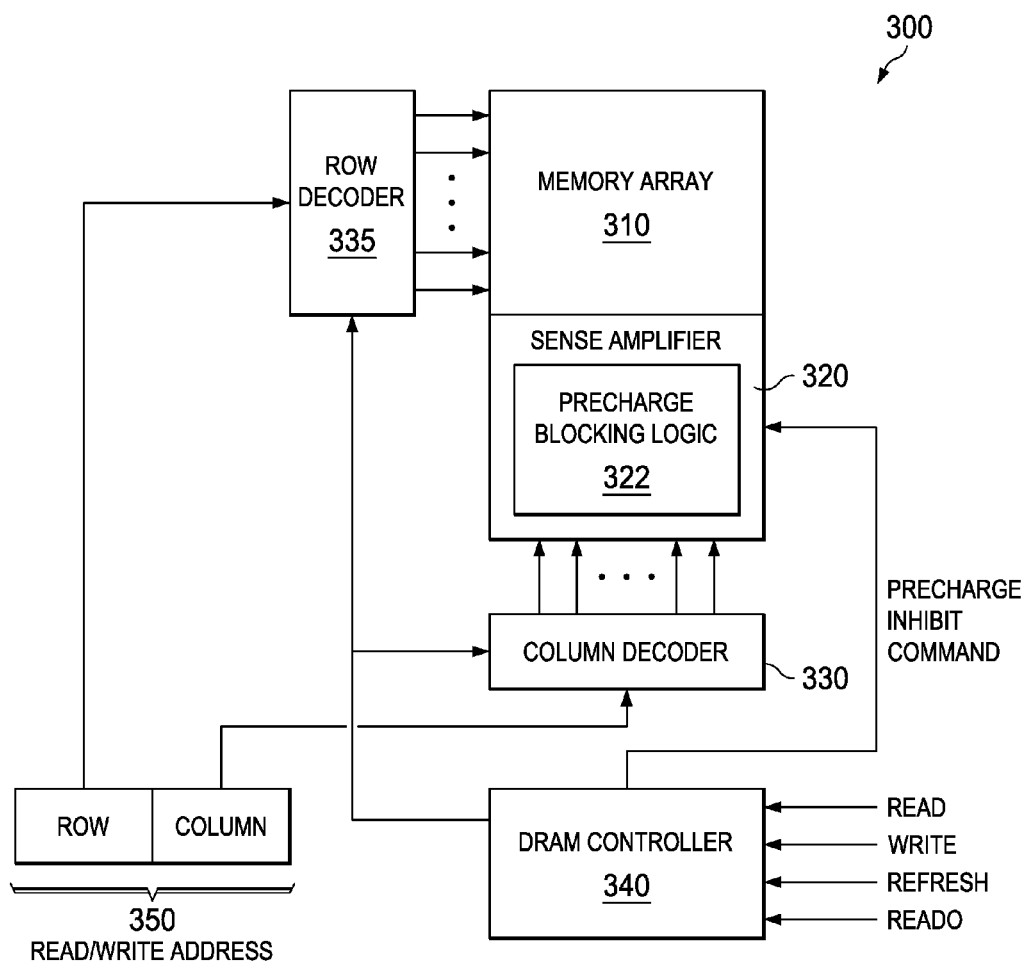
FIG. 3 is an example diagram of a dynamic random access memory (DRAM) structure in accordance with one illustrative embodiment.

FIG. 3 is an example diagram of a dynamic random access memory (DRAM) structure in accordance with one illustrative embodiment. The DRAM structure 300 comprises a memory array 310 and associated sense amplifier 320. The sense amplifier 320 receives signals from a column decoder 330 to select a column, i.e. bit lines, in the memory array 310. A row decoder 335 provides signals to the memory array 310 to open and close rows of the memory array 310, in the manner previously described above. The decoders 330 and 335 operate based on the row and column information in read/write address 350.

A DRAM controller 340 receives read command signals, write command signals, and refresh command signals. In addition, in accordance with the mechanisms of the illustrative embodiments, the DRAM controller 340 may also receive read without precharge, or "read only" (ReadO) command signals, that instruct the DRAM controller 340 to perform a read operation and then inhibit precharging of the memory cells that were read. Such ReadO command signals may be provided to the DRAM controller 340 from hardware units, such as a processor or the like, in response to the last cache miss in a series of cache misses targeting all portions of a DRAM row being executed, or triggered by store instructions. Such ReadO commands may be utilized by many different types of processes and applications. For example, such ReadO commands may be utilized by applications that process data only once to generate results and then discard the original data, e.g., scientific applications such as signal processing applications and the like.

The DRAM controller 340 provides control signals to the column decoder 330, sense amplifier 320, and row decoder 340 for reading/writing data from/to the memory array 310. In addition, in accordance with the mechanisms of the illustrative embodiments, the DRAM controller 340 sends control signals to the sense amplifier 320 for controlling the refresh/precharging of memory cells in the memory array 310. These control signals may be generated, for example, based on a determination by the DRAM controller 340 as to whether the data in the memory cells is to be retained in the memory array 310 or not, e.g., based on a determination as to whether the data is likely to be reused, not reused, is available in another memory structure, or is not available in another memory structure. That is, for a read operation, the DRAM controller 340 determines whether to read the data from the memory array 310 and then precharge the memory cells from which the read was performed, i.e. a standard DRAM read operation, or to read the data from the memory array 310 and then go to an idle state and not precharge the memory cells from which the read was performed, i.e. perform a read only (ReadO) operation without precharge.

Essentially, the DRAM controller 340 decides, for each predetermined portion of the memory array 310, e.g., a cache line length segment, whether to operate in a normal mode in which memory cells are precharged after reading, or to operate in an inhibit mode in which the precharging after the reading of the portion of memory array 310 is inhibited. If precharging is to be inhibited, the DRAM controller 340 sends a control signal to the sense amplifier 320 which causes the flow of charge from the sense amplifier 320 up the bit lines to the memory cells in order to precharge the memory cells to be blocked by precharge blocking logic 322 provided in the sense amplifier 320. In this way, the consumption of power by the DRAM structure 300 is reduced when the DRAM controller 340 determines that the memory cell that was read contains data that does not need to be retained in the DRAM structure 300 because it is either not going to be used again and/or is available from another memory structure such that it can be accessed from the other memory structure or retrieved from the other memory structure and brought back into the DRAM structure 300 if needed.

Figure 4:
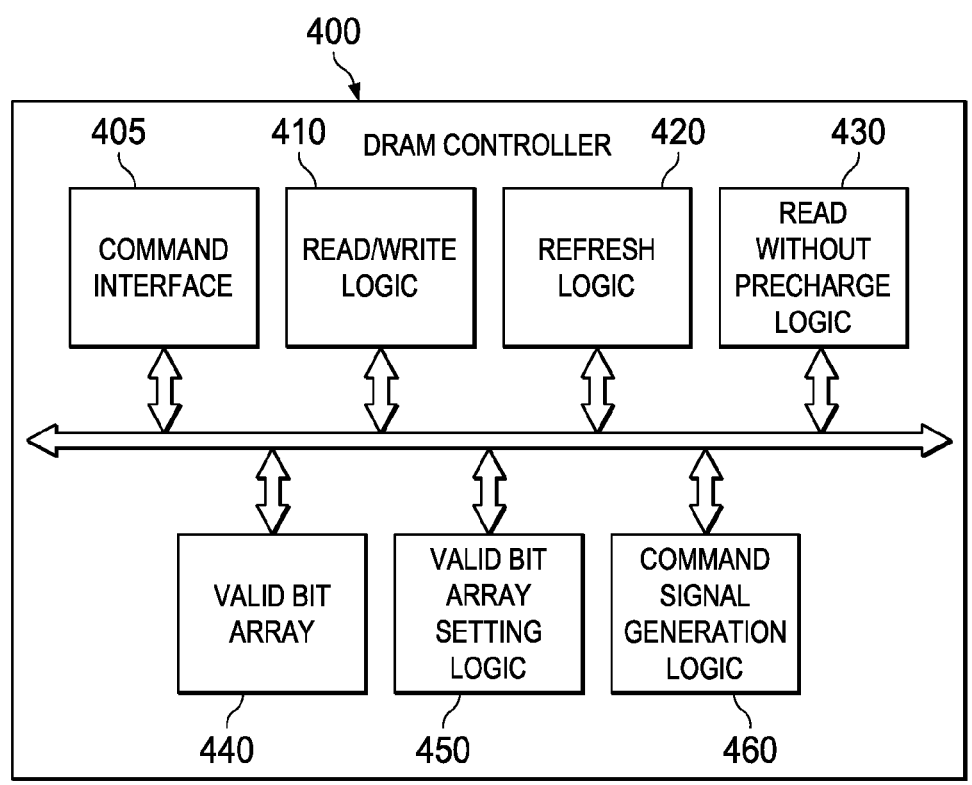
FIG. 4 is an example diagram of a DRAM controller in accordance with one illustrative embodiment.

FIG. 4 is an example diagram of a DRAM controller 400 in accordance with one illustrative embodiment. As shown in FIG. 4, the DRAM controller 400 includes a command interface 405, read/write logic 410, refresh logic 420, read without precharge logic 430, valid bit array 440, valid bit array setting logic 450 and command signal generation logic 460. These elements 410-460, in one illustrative embodiment, are provided as hardware circuit logic that operates in concert with the other circuit elements of the DRAM structure shown in FIG. 3 above. However, it should be appreciated that, in other illustrative embodiments, various ones of these elements may be implemented in software, such as firmware, instructions in a memory structure, or the like, or a combination of hardware and software.

The command interface 405 receives input read, write, and refresh command instructions from other hardware elements (not shown) of a data processing system, such as a processor, a memory controller, or the like. The read/write logic 410 and refresh logic 420 operate in a known manner in response to standard read and write commands or refresh commands being received via the command interface 405. Since the operation of a DRAM structure with regard to standard read, write, and refresh commands is generally known in the art, a more detailed explanation is not provided here.

The read without precharge logic 430 determines whether a read command targeting a portion of the DRAM structure's memory array should be performed as a standard read operation or as a read without precharge operation, i.e. a read only (ReadO) operation. If the read is to be performed as a read without precharge operation, then the read without precharge logic 430 instructs the command signal generation logic 460 to generate an appropriate control signal that is output to the sense amplifier of the DRAM structure instructing the sense amplifier's precharge blocking logic to be used to block precharging of the designated memory cells corresponding to the portion of the memory array from which the read operation is performed. This portion of the memory array may be a cache line length segment of the memory array, for example.

In one illustrative embodiment, the read without precharge logic 430 may determine whether a read command targeting a portion of the DRAM structure's memory array should be performed as a standard read operation or as a read without precharge operation optionally based on the state of valid bits in the valid bit array 440. In these illustrative embodiments, the optional valid bit array 440 stores a bit for each predetermined portion of the DRAM structure memory array. This predetermined portion may be, for example, a cache line length segment or the like. Depending on the particular structure of the DRAM memory array, each row of the DRAM structure memory array may store one or more of these cache line length segments. For example, in one illustrative embodiment, each row in the DRAM structure memory array has a size equivalent to a cache line of a cache memory into which data read from the DRAM structure memory array may be written. In this case, the valid bit array 440 may store a valid bit for each row of the DRAM structure memory array. In another illustrative embodiment, rows of the DRAM structure memory array may have a size larger or smaller than a cache line size and thus, cache line length segments may flow over from one row of the DRAM structure memory array to another. In this case, the valid bit array 440 may store a valid bit for each cache line length segment, independent of which row, or rows, in the DRAM structure memory array the cache line length segment is present.

The valid bit array setting logic 450 is responsible for setting and resetting valid bits for cache line length segments in the DRAM structure memory array based on the occurrence of various types of accesses to these cache line length segments. In particular, when a read without precharge, or "read only" (ReadO), command is received in the DRAM controller 400, the valid bit array setting logic 450 sets a valid bit associated with the portion of the DRAM structure memory array corresponding to the read without precharge command to a first value indicative of a need to inhibit precharging of the memory cells in the DRAM structure memory array that are read by the read without precharge command.

Moreover, these valid bits are reset to a second value indicating that precharging of the memory cells is no longer to be inhibited upon the occurrence of different events. For example, the valid bits for a portion of the DRAM structure memory array may be reset in response to a write of data to the portion of the DRAM structure. For example, if a cache line is evicted from a cache and written back to the DRAM structure memory array, then the valid bit array setting logic 450 may set the corresponding valid bit in the valid bit array 440 of the DRAM controller 400, for the portion of the DRAM structure memory array, to the second value.

The refresh logic 410 looks at the valid bit for the portion of the DRAM structure memory array to be refreshed to determine if the valid bit is set to the first value or not. If the valid bit is set to the first value, then the refresh logic 410 does not generate command signals that would otherwise refresh the associated portion of the DRAM structure. If the valid bit is not set to the first value, the refresh operation can be performed in a normal fashion with the associated memory cells in the DRAM structure memory array.

Figure 5:
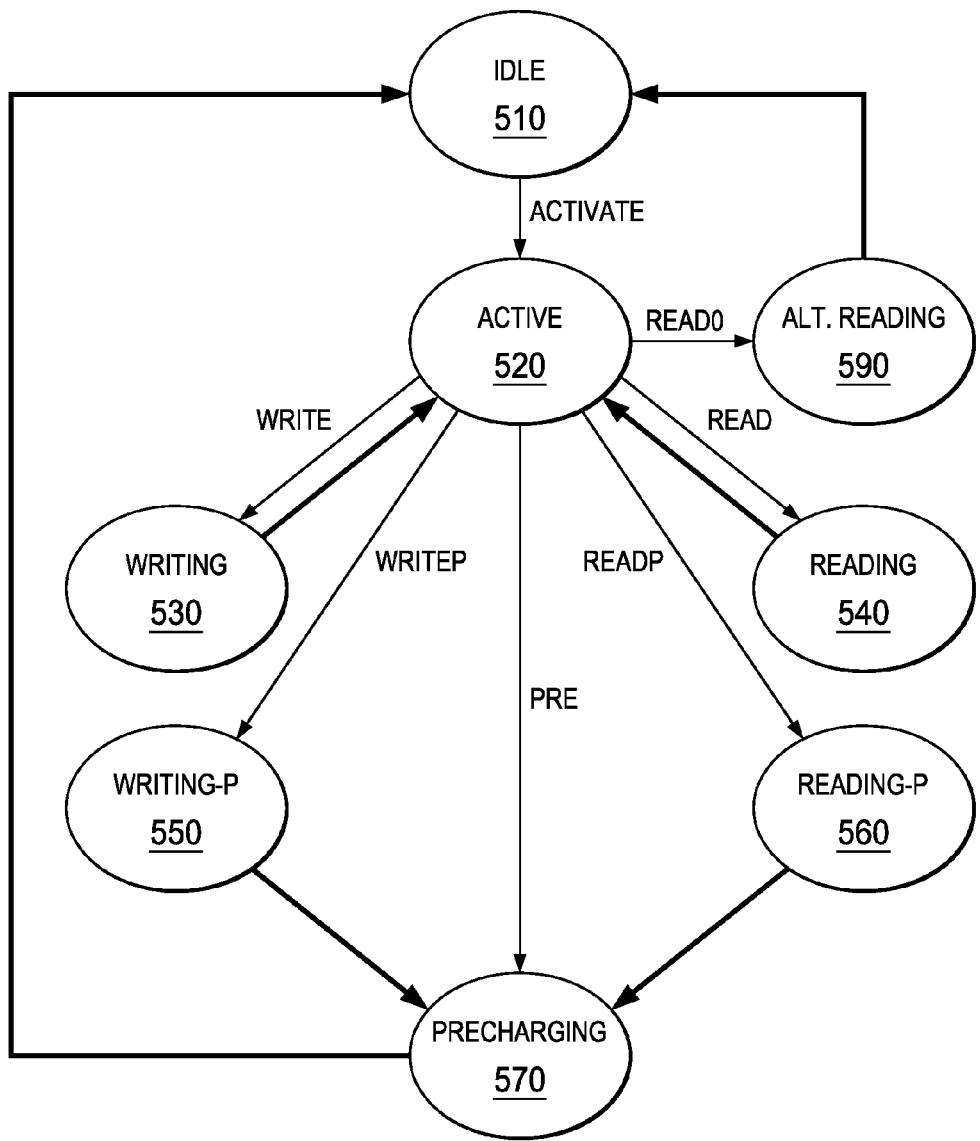
FIG. 5 is an example state diagram of a DRAM controller in accordance with one illustrative embodiment.

FIG. 5 is an example state diagram of a DRAM controller in accordance with one illustrative embodiment. The state diagram shown in FIG. 5 is a simplified state diagram used to emphasize the states associated with a read without precharge, or read only (ReadO), command in accordance with one illustrative embodiment. The state diagram may be followed by the DRAM controller logic for each predetermined portion of a DRAM structure memory array, e.g., each bank in the DRAM structure memory array. Darker arrows in the diagram represent automatic transitions from one state to another without the need for a separate command to be issued, while the less dark arrows represent commands issued to transition from one state to another.

As shown in FIG. 5, the portion of the DRAM structure memory array starts at an initial "Idle" state 510. The portion of the DRAM structure memory array is then activated through an activate command and transitions to an "active" state 520. From the activating state 520 various state transitions are available based on whether the operation to be performed is a write, a read, a write with precharge (WriteP), a read with precharge (ReadP), a precharge (Pre), or a read only, i.e. read without precharge (ReadO).

If the operation is a write (Write) command, then the state of the associated portion of the DRAM structure memory array transitions from an "Active" state 520 to a "Writing" state 530, and then automatically back to the "Active" state 520. This represents a normal write operation as is generally known in the art.

If the operation is a read (Read) command, then the state of the associated portion of the DRAM structure memory array transitions from an "Active" state 520 to a "Reading" state 540, and then automatically back to the "Active" state 520. This represents a normal read operation as is generally known in the art.

If the operation is a write with precharge (WriteP) command, the state of the associated portion of the DRAM structure memory array transitions from an "Active" state 520, to a "Writing-P" state 550, and then automatically to a "Precharging" 570 state. Thereafter, the state automatically transitions to an "Idle" state 510. This represents the write operation of a DRAM structure in which precharging of memory cells is performed after writing, as is generally known in the art.

If the operation is a read with precharge (ReadP) command, the state of the associated portion of the DRAM structure memory array transitions from an "Active" state 520, to a "Reading-P" state 580, and then automatically transitions to a "Precharging" state 570. Thereafter, the state transitions automatically back to the "Idle" state 510. This represents the read operation of a DRAM structure in which precharging of memory cells is performed after reading, as is generally known in the art.

If the operation is a Precharge (PRE) command, then the state of the associated portion of the DRAM structure memory array transitions from an "Active" state 520 to a "Precharging" state 570, and then automatically to an "idle" state 510.

If the operation is a read only (ReadO), then the state transitions to the alternative "Alt-Reading" state 590 where the portion of the DRAM structure memory array is read but there is no transition to the "Precharging" state 570 and there is no transition to the "Active" state. To the contrary, the state transitions from the alternative reading state 590 back to the idle state 510. Thus, the precharging is avoided with this alternative reading state 590.

Figure 6:
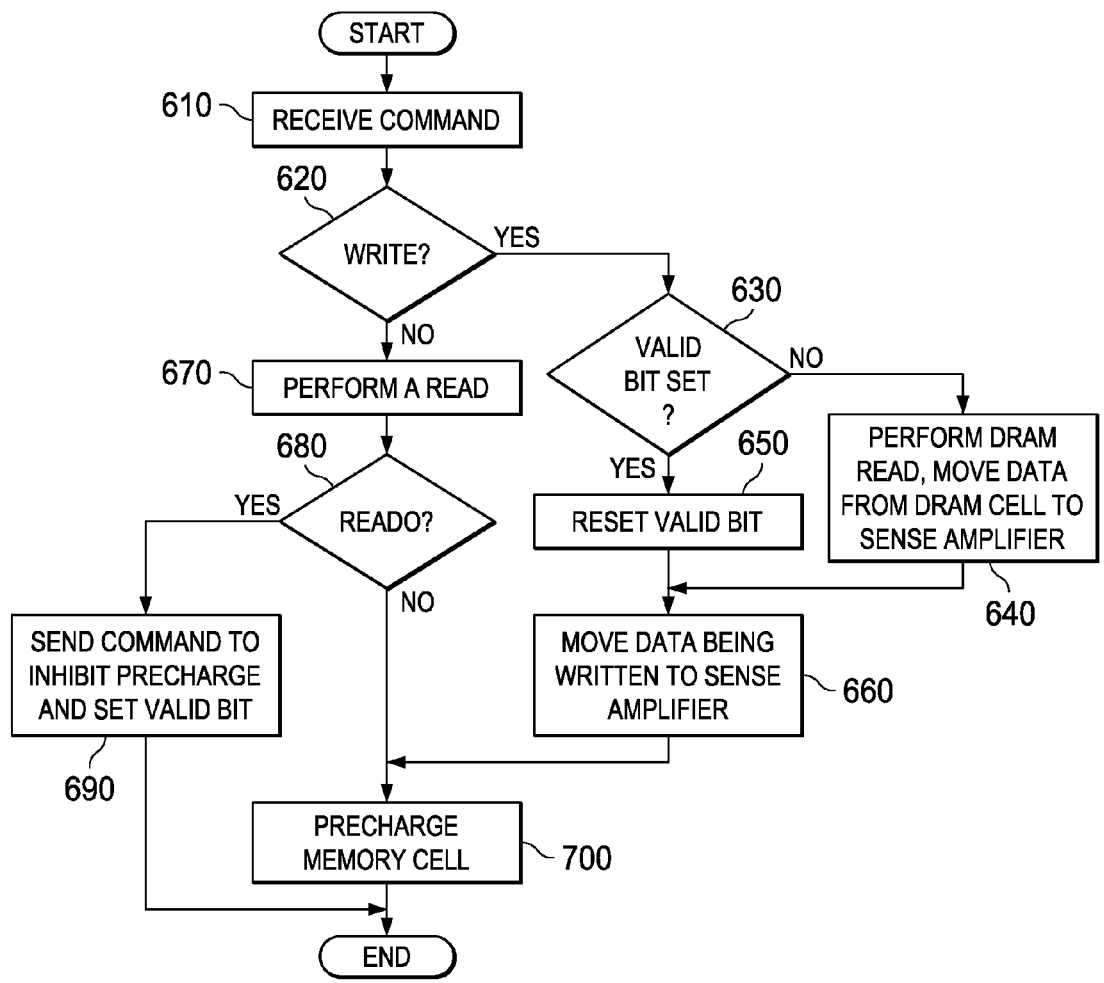
FIG. 6 is a flowchart outlining an example operation of a DRAM controller in accordance with one illustrative embodiment.

FIG. 6 is a flowchart outlining an example operation of a DRAM controller in accordance with one illustrative embodiment. As shown in FIG. 6, the operation starts with the receipt of a command (step 610). A determination is made as to whether the command is a write command (step 620). If the command is a write command, a determination is made as to whether a valid bit associated with the portion of the DRAM structure memory array is set to a value indicative of a need to inhibit precharging or not (step 630). If the valid bit is set to a value indicative of a need to inhibit precharging, then a valid bit associated with the portion of the DRAM structure memory array is reset to a value indicative of a need to perform precharging (step 650) and the write data is moved into the DRAM sense amplifier and precharged to the associated memory cells without reading data from the associated DRAM cell to the sense amplifier (step 660). If the valid bit is not set to a value indicative of inhibiting precharging, the normal read, modify, and precharge sequence will be performed (step 640) and the operation then terminates.

If the command is not a write command, a read operation is performed (step 670). A determination is then made as to whether the command is a read without precharge command (step 680). If the command is a read without precharge command, then a command signal is sent to precharging blocking logic to inhibit precharging of the memory cells accessed by the command and a valid bit associated with the portion of the DRAM structure memory array is set to a value indicative of a need to inhibit precharging (step 690). If the command is not a read with precharge command, then precharging of the memory cells accessed by the command is performed (step 700) and the operation then terminates.

Thus, the illustrative embodiments provide a mechanism for inhibiting the precharging of memory cells in a DRAM structure memory array when it is determined that the data in the memory cells is not going to be used again and is available in another memory structure. This reduces power consumption and reduces DRAM busy time by avoiding the precharging of memory cells in the event that the data in the memory cells is not going to be used again and can be accessed from another memory structure.

It should be appreciated that while the illustrative embodiments are described in terms of a distinction between standard read operations in which there are precharging of the DRAM cells performed after reading, and the new ReadO operation in which precharging is inhibited, in another illustrative embodiment, any read from the DRAM may result in the valid bit being set to an invalid state and the data may then not be precharged/refreshed in the DRAM cell. In such a case, all data evicted from the caches would be written back to the DRAM memory, even if it has not been modified since being read out of the DRAM.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for inhibiting precharging of memory cells of a dynamic random access memory (DRAM) structure, comprising:
    receiving a command for accessing a memory cell of the DRAM structure;
    determining, based on the command, if precharging the memory cell following accessing the memory cell is to be inhibited; and
    sending, in response to the determination indicating that precharging the memory cell is to be inhibited, a command to blocking logic of the DRAM structure to block precharging of the memory cell following accessing the memory cell.

2. The method of claim 1, wherein the command is a read command for reading data from the memory cell of the DRAM structure.

3. The method of claim 1, wherein the command is a DRAM read with intent to modify command indicating that data read from the memory cell is going to be modified after reading and, as a result, precharging of the memory cell is to be inhibited.

4. The method of claim 1, further comprising:
    disabling cyclical refresh of the memory cell until a future modification of data corresponding to the memory cell is written back to the DRAM structure.

5. The method of claim 1, wherein determining if precharging the memory cell following accessing the memory cell is to be inhibited comprises determining if a valid bit associated with the memory cell is set to a first value indicative of a need to inhibit the precharging of the memory cell.

6. The method of claim 5, wherein there is a valid bit in a DRAM controller for each predetermined portion in the DRAM structure, and wherein each predetermined portion comprises one or more memory cells of the DRAM structure.

7. The method of claim 5, further comprising:
    in response to a write of data corresponding to the memory cell back to the DRAM structure:
    clearing the valid bit associated with the memory cell; and
    re-enabling cyclical refreshing of the memory cell.

8. The method of claim 5, further comprising:
    in response to an eviction of data corresponding to the memory cell from a cache of the data processing system:
    writing back the data corresponding to the memory cell, to the DRAM structure;
    clearing the valid bit associated with the memory cell; and
    re-enabling cyclical refreshing of the memory cell.

9. The method of claim 1, further comprising:
    receiving a request to access data from the memory cell; and
    redirecting the request to another storage location of another storage device where the data is present.

10. The method of claim 1, wherein the command is received from a hardware unit in a processor of the data processing system in response to one of a cache miss targeting all portions of a row in the DRAM structure or a store instruction.

11. An apparatus, comprising:
    a dynamic random access memory (DRAM) structure; and
    a DRAM controller coupled to the DRAM structure, wherein the DRAM controller:
    receives a command for accessing a memory cell of the DRAM structure;
    determines, based on the command, if precharging the memory cell following accessing the memory cell is to be inhibited; and
    sends, in response to the determination indicating that precharging the memory cell is to be inhibited, a command to blocking logic of the DRAM structure to block precharging of the memory cell following accessing the memory cell.

12. The apparatus of claim 11, wherein the command is a read command for reading data from the memory cell of the DRAM structure.

13. The apparatus of claim 11, wherein the command is a DRAM read with intent to modify command indicating that data read from the memory cell is going to be modified after reading and, as a result, precharging of the memory cell is to be inhibited.

14. The apparatus of claim 11, wherein the DRAM controller disables cyclical refresh of the memory cell until a future modification of data corresponding to the memory cell is written back to the DRAM structure.

15. The apparatus of claim 11, wherein the DRAM controller determines if precharging the memory cell following accessing the memory cell is to be inhibited by determining if a valid bit associated with the memory cell is set to a first value indicative of a need to inhibit the precharging of the memory cell.

16. The apparatus of claim 15, wherein there is a valid bit in the DRAM controller for each predetermined portion in the DRAM structure, and wherein each predetermined portion comprises one or more memory cells of the DRAM structure.

17. The apparatus of claim 15, wherein the DRAM controller, in response to a write of data corresponding to the memory cell back to the DRAM structure:
clears the valid bit associated with the memory cell; and
re-enables cyclical refreshing of the memory cell.

18. The apparatus of claim 15, further comprising a cache, and wherein the DRAM controller, in response to an eviction of data corresponding to the memory cell from the cache:
writes back the data corresponding to the memory cell, to the DRAM structure;
clears the valid bit associated with the memory cell; and
re-enables cyclical refreshing of the memory cell.

19. The apparatus of claim 11, wherein the DRAM controller:
receives a request to access data from the memory cell; and
redirects the request to another storage location of another storage device where the data is present.

20. The apparatus of claim 11, wherein the command is received from a hardware unit in a processor of the apparatus in response to one of a cache miss targeting all portions of a row in the DRAM structure or a store instruction.

* * * * *